United States Patent
Becker et al.

(10) Patent No.: US 6,980,607 B2
(45) Date of Patent: Dec. 27, 2005

(54) METHOD FOR DECODING A DATA SIGNAL

(75) Inventors: Burkhard Becker, Ismaning (DE); Markus Dötsch, Schliern (CH); Peter Jung, Otterberg (DE); Tideya Kella, München (DE); Jörg Plechinger, München (DE); Peter Schmidt, Ellerstadt (DE); Michael Schneider, München (DE)

(73) Assignee: Infineon Technologies AG, Munich (DE)

( * ) Notice: Subject to any disclaimer, the term of this patent is extended or adjusted under 35 U.S.C. 154(b) by 297 days.

(21) Appl. No.: 10/197,788

(22) Filed: Jul. 18, 2002

(65) Prior Publication Data

US 2003/0012311 A1 Jan. 16, 2003

Related U.S. Application Data

(63) Continuation of application No. PCT/DE01/00154, filed on Jan. 15, 2001.

(30) Foreign Application Priority Data

Jan. 18, 2000 (DE) .......................................... 100 01 856

(51) Int. Cl.⁷ .......................... H04L 23/02; H04L 27/06
(52) U.S. Cl. ........................ 375/341; 375/242; 375/262; 375/265
(58) Field of Search ................................ 375/262, 265, 375/316, 340, 341, 241, 242; 714/780, 792, 795, 796

(56) References Cited

U.S. PATENT DOCUMENTS

| | | | |
|---|---|---|---|
| 5,933,462 A | 8/1999 | Viterbi et al. | |
| 6,014,411 A | 1/2000 | Wang | |
| 6,023,783 A * | 2/2000 | Divsalar et al. | ............ 714/792 |
| 6,128,765 A | 10/2000 | Ross et al. | |
| 6,161,209 A * | 12/2000 | Moher | ......................... 714/780 |
| 6,272,183 B1 | 8/2001 | Berens et al. | |
| 6,304,996 B1 * | 10/2001 | Van Stralen et al. | ......... 714/796 |
| 6,370,669 B1 * | 4/2002 | Eroz et al. | .................... 714/774 |
| 6,563,877 B1 * | 5/2003 | Abbaszadeh | ................ 375/242 |
| 6,571,366 B1 | 5/2003 | Doetsch et al. | |
| 6,598,204 B1 * | 7/2003 | Giese et al. | ................. 714/795 |

FOREIGN PATENT DOCUMENTS

| | | |
|---|---|---|
| DE | 44 37 984 A1 | 8/1996 |
| EP | 0 963 048 A2 | 12/1999 |
| WO | 99/11009 | 3/1999 |
| WO | 99/11010 | 3/1999 |
| WO | 99/11011 | 3/1999 |
| WO | 99/11013 | 3/1999 |

OTHER PUBLICATIONS

60/120,738.*
Bai, B. et al.: "Novel Algorithm for Continuous Decoding of Turbo Codes", IEE Proc. Commun., vol. 146, No. 5, Oct. 1999, pp. 271–274.
Jung, P.: "Analyse und Entwurf digitaler Mobilfunksysteme" [Analysis and Layout digital Mobile Radio Systems], B. G. Teubner, 1997, pp. 343–368.
Author not listed: "MAP04T Very High Speed MAP Decoder", Small World Communications, Version 0.1, Jun. 28, 1999, pp. 1–12.

* cited by examiner

*Primary Examiner*—Young T. Tse
*Assistant Examiner*—Sam K. Ahn
(74) *Attorney, Agent, or Firm*—Laurence A. Greenberg; Werner H. Stemer; Gregory L. Mayback

(57) ABSTRACT

A turbo decoder is used in a method for blockwise decoding a data signal that is error protection coded at a transmitter and that is detected in a receiver. The turbo decoder includes two feedback symbol estimators. In order to calculate its output values, at least one of the symbol estimators executes, with reference to a data block being considered, a plurality of forward and/or backward recursions over subintervals of the data block.

7 Claims, 4 Drawing Sheets

METHOD FOR DECODING A DATA SIGNAL

CROSS-REFERENCE TO RELATED APPLICATION

This application is a continuation of copending International Application No. PCT/DE01/00154, filed Jan. 15, 2001, which designated the United States and was not published in English.

BACKGROUND OF THE INVENTION

FIELD OF THE INVENTION

The invention relates to a method for decoding a data signal that is transmitted via a radio channel and that is error protection coded using a turbo code.

In communication systems, for example mobile radio systems, the signal (speech signal, for example) that will be transmitted is subjected to conditioning in a source coder of a channel coding unit. The channel coding unit serves the purpose of adapting the signal that will be transmitted to the properties of the transmission channel. Effective error protection is achieved in this case by specifically introducing redundancy into the signal that will be transmitted.

Binary, parallel-concatenated recursive convolutional codes are designated as so-called "turbo codes". Turbo codes constitute a powerful form of error protection coding, particularly in the case of the transmission of large data blocks.

A turbo decoder is used in the receiver for the purpose of decoding turbo codes. A turbo decoder includes two individual convolutional decoders that are connected to one another in feedback fashion.

A distinction is made in the case of convolutional decoders between symbol estimators—which operate using a character-by-character algorithm—and sequence estimators. An MAP (maximum a posteriori) symbol estimator is a special form of a symbol estimator. Such an estimator operates using the so-called MAP (maximum a posteriori) algorithm. MAP symbol estimators have the advantage that a bit error ratio that is as low as possible can be achieved with you.

A turbo decoder with two recursively connected MAP symbol estimators is disclosed in the book, representing the closest prior art, entitled "Analyse und Entwurf digitaler Mobilfunksysteme" ["Analysis and design of digital mobile radio systems"], by P. Jung, Stuttgart, B. G. Teubner, 1997 on pages 343–368, in particular FIG. E.2. A turbo code interleaver is arranged between the two MAP symbol estimators.

In the case of a blockwise turbo code decoding, a decoded data symbol is estimated on the basis of input sequences of a finite number N of bits. N is denoted as the block size.

A recursion method is applied in each MAP symbol estimator in order to calculate the decoded data values. The recursion method includes a forward recursion and a backward recursion. Both recursions are carried out over the entire block length (that is to say from the first bit of the block up to the last bit of the block or from the last bit of the block up to the first bit of the block).

This results in the requirement of buffering the result data obtained from the recursions in the MAP symbol estimator. The MAP symbol estimator therefore requires a memory whose size is sufficient for storing the result data of the forward recursion and the backward recursion with reference to at least one data block.

Consequently, a large storage requirement is required in the MAP symbol estimator (particularly in the case of the decoding of large data blocks in the case of which the particular advantages of turbo decoding come to bear).

This is disadvantageous, since the required memory size constitutes a substantial cost factor in mobile stations.

SUMMARY OF THE INVENTION

It is accordingly an object of the invention to provide a method for decoding a data signal that has been coded for error protection using a turbo code, which overcomes the above mentioned disadvantages of the prior art methods of this general type.

In particular, it is an object of the invention to provide a method for decoding a data signal that has been coded for error protection using a turbo code in which the method requires an amount of memory space that is as low as possible. In other words, the method permits the implementation of cost-effective turbo decoders.

With the foregoing and other objects in view there is provided, in accordance with the invention, a method for blockwise decoding a data signal. The method includes steps of: in a transmitter, using a turbo code to error protection code the data signal; transmitting the data signal using a radio channel; providing a receiver having a turbo decoder with two feedback symbol estimators; and using the turbo decoder to detect the data signal by having at least one of the symbol estimators execute a plurality of recursions in order to calculate output values for the data block. Each one of the plurality of the recursions is either a forward recursion over a subinterval of the data block or a backward recursion over a subinterval of the data block.

In the inventive method, the forward recursion run previously carried out in a blockwise fashion and/or the backward recursion run previously carried out in blockwise fashion are replaced by a plurality of forward and backward recursion runs performed segment by segment (with reference to a data block considered). The importance of this for calculating a specific decoded output value of the MAP symbol estimator considered is that instead of the rigid, blockwise recursions there is a need only for a forward and/or backward recursion over a suitably selectable subinterval of the data block.

This substantially reduces the number of the result data that needs to be buffered in the MAP symbol estimator considered, that is to say, it permits a more cost-effective hardware structure.

A particularly preferred stipulation of the recursion interval limits is defined in that each subinterval for a forward recursion is assigned, for a backward recursion, a subinterval which includes the subinterval for the forward recursion. In addition, the calculation of the nth output value of the data block is based only on a forward recursion over the subinterval including the nth data value and on a backward recursion over the assigned subinterval.

The length of a subinterval for the forward recursion is preferably between 10 and 30 data values, and is in particular 20 data values.

In order to reduce the signal processing outlay, the inventive method can advantageously be combined with a calculating method for determining the output values of the symbol estimators, which is based on a suboptimal MAP algorithm. A suboptimal MAP algorithm is a reduced outlay version of the MAP algorithm that (by contrast with the MAP algorithm) admittedly does not render possible any maximum bit error ratio of the output values, but covers fewer computational steps. The combination (segment-by-segment recursion, suboptimal MAP algorithm) creates a turbo decoding method forming a compromise between the memory space requirement and the computational outlay that is decidedly favorable for practical applications.

Other features which are considered as characteristic for the invention are set forth in the appended claims.

Although the invention is illustrated and described herein as embodied in a method for decoding a data signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and-advantages thereof will be best understood from the following description of specific embodiments when read in connection with the accompanying drawings.

DESCRIPTION OF THE PREFERRED EMBODIMENTS

Figure 1:
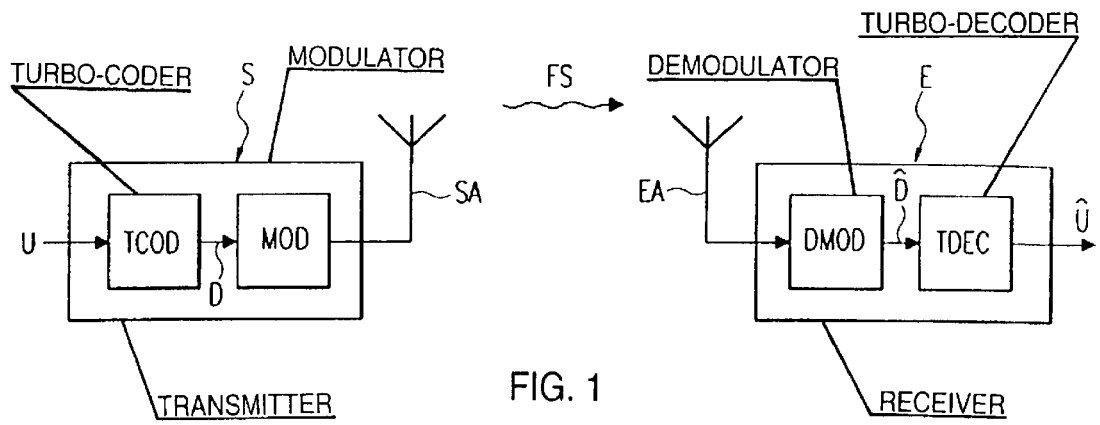
FIG. 1 is a schematic illustration of the air interface of a mobile radio system with a transmitter and a receiver.

Referring now to the figures of the drawing in detail and first, particularly, to FIG. 1 thereof, there is shown a transmitter S and a receiver E of a mobile radio system. The transmitter S is included, for example, in a base station, and the receiver E in a mobile station of the mobile radio system.

The transmitter S has a turbo coder TCOD, a modulator MOD and a transmitting antenna SA.

The turbo coder TCOD receives a digital input signal in the form of data symbols (for example bits) $u_1, u_2, \ldots$ A finite sequence $U=(u_1, u_2, \ldots, u_N)$, including N input signal data symbols (bits) $u_n$, n=1, 2, $\ldots$, N, is considered below on the basis of the blockwise coding. As previously mentioned, the number N is denoted as the block size.

The input signal carries an item of useful information to be transmitted, for example a speech message. It can be generated, for example, via a microphone-amplifier-analog/digital converter circuit chain (not illustrated).

The turbo coder TCOD adds redundancy to the digital input signal for the purpose of error protection coding. An error protection coded data signal in the form of a sequence D including K data symbols (bits), $D=(d_1, d_2, \ldots, d_K)$ is present at the output of the turbo coder D.

The ratio N/K (number of input bits/number of output bits) is designated as the code rate $R_c$ of a coder.

A modulator MOD modulates the error protection coded data signal onto a carrier signal. The carrier signal modulated by the error protection coded data signal is spectrally shaped, in a way not illustrated, by a transmission filter and is amplified by a transmitter amplifier before it is emitted as the radio signal FS by the transmitting antenna SA.

The receiver E has a receiving antenna EA, a demodulator DMOD and a turbo decoder TDEC.

The receiving antenna EA receives the radio signal FS disturbed by environmental influences and interference with radio signals of other subscribers, and feeds it to the demodulator DMOD.

The demodulator DMOD equalizes the received radio signal FS taking account of the signal interference suffered in the radio channel. An equalized data signal provided at the output of the demodulator DMOD is present in the form of a symbol sequence $\hat{D}=(\hat{d}_1, \hat{d}_2, \ldots, \hat{d}_K)$, whose elements $\hat{d}_1, \hat{d}_2, \ldots, \hat{d}_K$ are continuous-value estimates of the data symbols $d_1, d_2, \ldots, d_K$ of the error protection coded data signal sequence D.

The equalized data signal is sent to the turbo decoder TDEC, at whose output a decoded output signal sequence $\hat{U}=(\hat{u}_1, \hat{u}_2, \ldots, \hat{u}_N)$ is provided. The elements $\hat{u}_1, \hat{u}_2, \ldots, \hat{u}_N$ of the decoded output signal sequence $\hat{U}$ are hypotheses of the data symbols $u_1, u_2, \ldots, u_N$ of the input signals at the transmitting end in the form of discrete values from the symbol supply (for example 0,1) of the input signal.

The bit error rate is defined by the relative frequency of misestimates $u_n \neq \hat{u}_n$, n=1, 2, $\ldots$ It may not exceed a specific maximum permissible value in the case of mobile radio applications.

Figure 2:
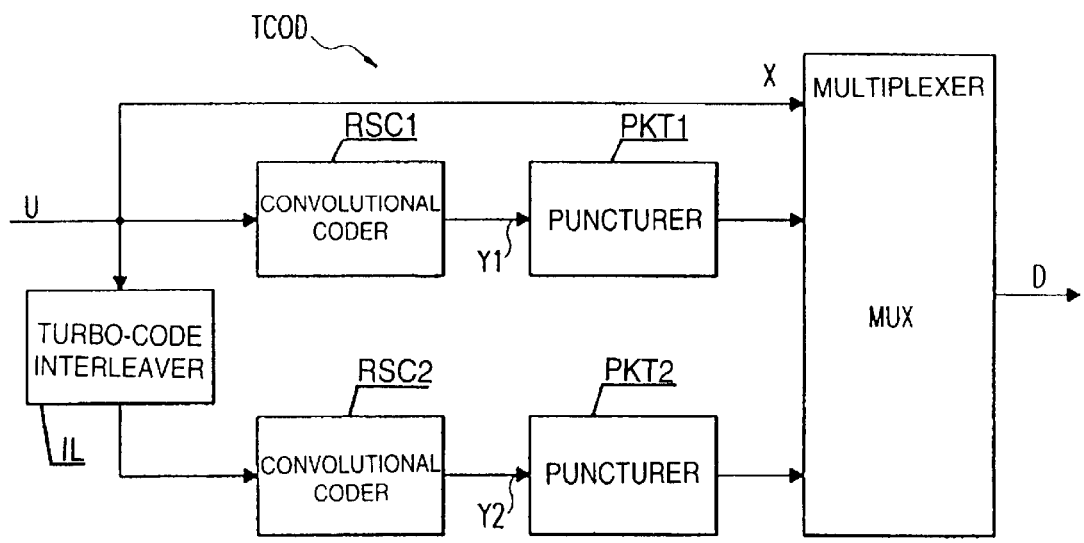
FIG. 2 is a block diagram of a turbo coder for generating a turbo code.

For better understanding the invention, the generation of a turbo code is first explained using FIG. 2 before describing an exemplary embodiment of the inventive decoding method.

A turbo coder TCOD has two identical binary recursive systematic convolutional coders RSC1 and RSC2, as they are known in coding technology. Connected to the input, upstream of the second recursive systematic convolutional coder RSC2, is a turbo code interleaver IL which causes the coding to be performed in a blockwise fashion. The outputs of the two convolutional coders RSC1 and RSC2 are connected in each case to a multiplexer MUX via puncturer PKT1 and PKT2, respectively. Furthermore a signal sequence X that is identical to the digital input signal sequence U is fed to the multiplexer MUX.

Figure 3:
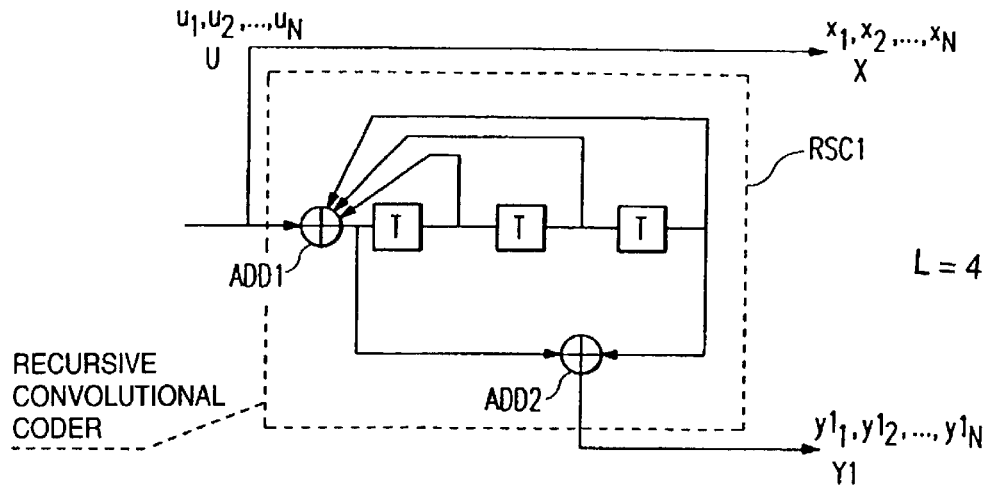
FIG. 3 is a block diagram of the RSC convolutional coder illustrated in FIG. 2.

FIG. 3 shows the design of a recursive convolutional coder using RSC1 as an example. The convolutional coder RSC1 has, on the input side, a first adder ADD1 and a shift register, connected downstream of the first adder ADD1, with, for example, three memory cells T. At its output, the convolutional coder RSC1 provides a redundancy data sequence $Y1=(y1_1, y1_2, \ldots, y1_N)$ that is formed by a second adder ADD2.

It is clear that a redundancy data symbol $y1_n$ (n=1, 2, $\ldots$, N) present at the output at a specific instant is a function of the current input data symbol $u_n$ of the input signal sequence U and of the state of the shift register. The state of the shift register is a function, in turn, of the last 3 input data symbols. The fallback depth L is designated as the number of data symbols (binary characters) that are available at ADD1 for combination, that is to say here L=4.

The design of the second convolutional coder RSC2 is identical to the design of the first convolutional coder RSC1. RSC2 provides a redundancy data sequence $Y2=(y2_1, y2_2, \ldots, y2_N)$ at its output.

The unchanged input signal sequence U can be regarded as second output of the first convolutional coder RSC1. That is to say from this point of view, the first convolutional coder RSC1 includes a second output at which there is output the data sequence X whose elements $x_1, x_2, \ldots, x_N$ are identical to the elements $u_1, u_2, \ldots, u_N$ of the input signal sequence U. A similar statement holds for the second convolutional coder RSC2, and a second output of the second convolutional coder RSC2, which is identical to the interleaved input signal sequence U. Coders with this property are designated generally as systematic coders.

Exactly two output data symbols $x_n$ and $y1_n$ or $x_n$ and $y2_n$ are then output per input data symbol $u_n$ by each convolutional coder RSC1 and RSC2, respectively. Each convolutional coder RSC1, RSC2 therefore has a coding rate of $R_c=0.5$.

The multiplexer MUX serves to set the coding rate of the turbo coder TCOD. In order also to achieve a coding rate of, for example, $R_c=0.5$ for TCOD, the two redundancy sequences Y1 and Y2 are alternately punctured and multiplexed. The redundancy data sequence $Y=(y1_1, y2_2, y1_3, y2_4, \ldots, y1_N, y2_N)$ resulting in this case is subsequently multiplexed alternately with the systematic data sequence X. The error protection coded data signal yielded in the case of this (special) form of turbo coding therefore has the form of $D=(x_1, y1_1, x_2, y2_2, x_3, y1_3, x_4, y2_4, \ldots, x_N, y2_N)$ (N may be assumed to be an even number)

The convolutional coder RSC1 can be interpreted as a finite, clocked automaton and can be described by a so-called trellis diagram with M possible states. The trellis diagram of the convolutional coder RSC1 with a shift register of 3 cells has $M=2^3=8$ nodes that correspond to the possible states of the shift register. An (arbitrary) first state m that goes over into a second state m' through the input of one input bit ($u_n=0$ or 1) is connected to this in the trellis diagram by a connecting line. Each redundancy subsequence Y1 corresponds to a specific path along connecting lines through the trellis diagram of the RSC1 coder.

Trellis diagrams for illustrating the states of coders are known and will not be explained in more detail here.

Figure 4:
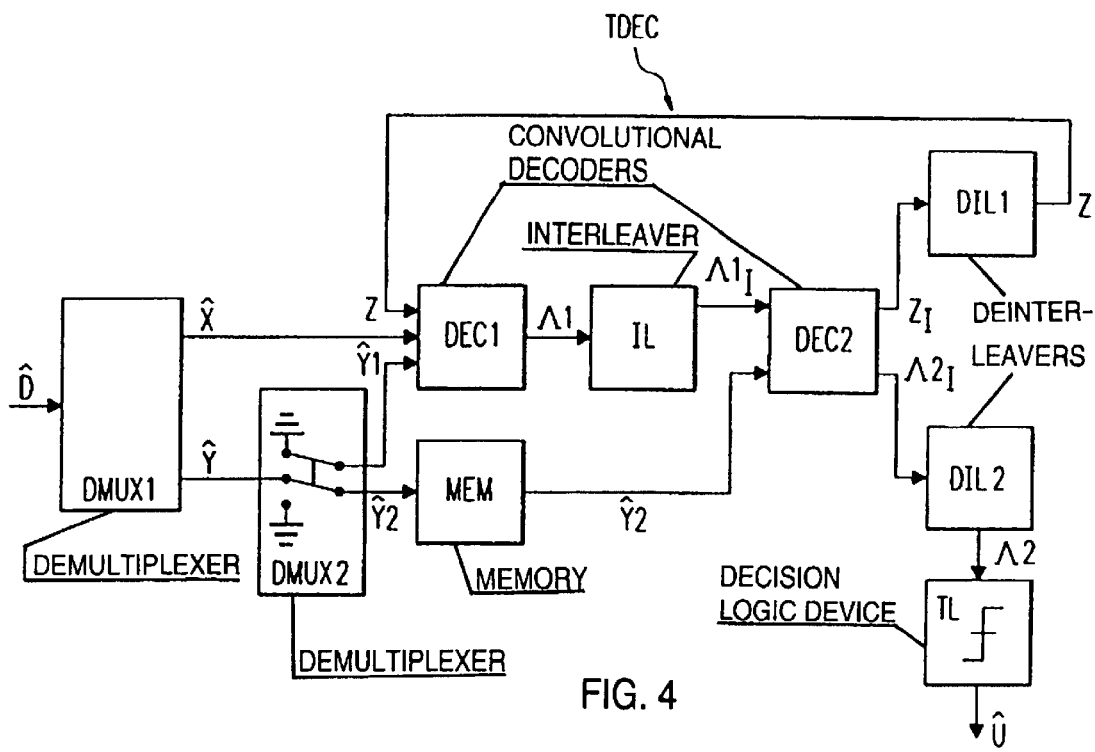
FIG. 4 is a block diagram of the turbo decoder illustrated in FIG. 1.

The inventive decoding method is explained below with reference to the turbo decoder TDEC shown in FIG. 4.

The turbo decoder TDEC includes a first and a second demultiplexer DMUX1 and DMUX2, a memory MEM, a first and a second convolutional decoder DEC1 and DEC2, an interleaver IL, a first and a second de-interleaver DIL1 and DIL2, and a decision logic device (threshold value decision element) TL.

The convolutional decoders DEC1 and DEC2 are symbol estimators.

The equalized data sequence:
$\hat{D}=(\hat{x}_1, \hat{y}1_1, \hat{x}_2, \hat{y}2_2, \hat{x}_3, \hat{y}1_3, \hat{x}_4, \hat{y}2_4, \ldots, \hat{x}_N, \hat{y}2_N)$ fed to the turbo decoder TDEC by the demodulator DMOD is split up by the first demultiplexer DMUX1 into the equalized systematic data sequence $\hat{X}$ (detected version of the input signal sequence U(=X)) and the equalized redundancy sequence $\hat{Y}$ (detected version of the redundancy sequence Y).

The second demultiplexer DMUX 2 splits up the equalized redundancy sequence $\hat{Y}$ into the two equalized redundancy subsequences $\hat{Y}1$ and $\hat{Y}2$ (detected versions of the redundancy subsequences Y1 and Y2). The equalized (estimated) versions of the data symbols $x_n, y1_n, y2_n$ occurring at the transmitting end are denoted by $\hat{x}_n, \hat{y}1_n, \hat{y}2_n$, (n=1, 2, \ldots, N).

Starting from the sequences $\hat{X}$ and $\hat{Y}1$ and a feedback sequence Z, the first decoder DEC1 calculates a sequence of reliability information $\Lambda1=(\Lambda1(u_1), \Lambda1(u_2), \ldots, \Lambda1(u_N))$.

Each element $\Lambda1(u_n)$ of the sequence $\Lambda1$ is a continuous-valued logarithmic probability ratio for the uncoded data symbol $u_n$ of the input signal sequence U, $$\Lambda1(u_n) = \ln\left\{\frac{P(u_n = 1|\hat{X}, \hat{Y}1, Z)}{P(u_n = 0|\hat{X}, \hat{Y}1, Z)}\right\}; \quad (1)$$

where $P(u_n=1|\hat{X}, \hat{Y}1, Z)$ and $P(u_n=0|\hat{X}, \hat{Y}1, Z)$ respectively designate the conditional probabilities that the data symbol $u_n$ is equal to 1 or equal to 0 on condition that the sequences $\hat{X}, \hat{Y}1, Z$ are observed. These conditional probabilities are "a-posteriori probabilities", since the probabilities of the uncoded data symbols (here: bits) $u_1$ to $u_N$ on which an event (the detected sequences $\hat{X}, \hat{Y}1, Z$) which has occurred is based are deduced from this event.

The element $\Lambda1(u_n)$ of the sequence of reliability information $\Lambda1$ are also designated as LLRs (Log Likelihood Ratios).

The sequence of reliability information $\Lambda1$ is interleaved by the interleaver IL and fed as an interleaved sequence of reliability information $\Lambda1_I$ to the second convolutional decoder DEC2. The second convolutional decoder DEC2 calculates an interleaved feedback sequence $Z_I$ and an interleaved sequence $\Lambda2_I$ from the interleaved sequence of reliability information $\Lambda1_I$ and from the sequence $\hat{Y}2$.

The interleaved feedback sequence $Z_I$ is de-interleaved by the first de-interleaver DIL1 and yields the feedback sequence Z. The elements $\Lambda2_I(u_n)$ of the sequence $\Lambda2_I$ are likewise continuous-valued a-posteriori probability ratios for the uncoded data symbols $u_1$ to $u_N$ of the input signal sequence U, that is to say $$\Lambda2_I(u_n) = \ln\left\{\frac{P(u_n = 1|\Lambda1_I, \hat{Y}2)}{P(u_n = 0|\Lambda1_I, \hat{Y}2)}\right\} \quad (2)$$

the notation already explained being used.

The sequence $\Lambda2_I$ is de-interleaved by the second interleaver DIL2 and is fed as a de-interleaved sequence $\Lambda2$ to the decision logic device TL. The decision logic device TL determines a reconstructed data symbol $\hat{u}_n=0$ for each element $\Lambda2(u_n)$ of the sequence $\Lambda2$ with a value$\leq0$ and a reconstructed data symbol (bit) $u_n=1$ for each element of $\Lambda2$ with a value$>0$.

The mode of calculation of the LLRs $\Lambda1(u_n)$ and $\Lambda2_I(u_n)$ is characteristic of a turbo decoding method. The recursive calculation of $\Lambda1$ is explained below.

The state of the convolutional coder RSC1 at the instant n (that is to say in the case of the input data symbol $u_n$) is denoted by $S_n$.

The conditional a-posteriori probabilities in equation 1 can be expressed as sums of individual a-posteriori probabilities via the M possible states of the coder RSC1:

$$\Lambda1(u_n) = \ln\left\{\frac{\sum_{m=1}^{M} P(u_n = 1, S_n = m|\hat{X}, \hat{Y}1, Z)}{\sum_{m=1}^{M} P(u_n = 0, S_n = m|\hat{X}, \hat{Y}1, Z)}\right\} \quad (3)$$

The individual probabilities can be written in the following form:

$P(u_n=i, S_n=m|\hat{X}, \hat{Y}1, Z)=\alpha_n^i(m)\cdot\beta_n(m)$  $i=0, 1$;

where $$\alpha_n^i(m) = P(u_n = u, S_n = m | R_1^n), \text{ and}$$

$$\beta_n(m) = \frac{p(R_{n+1}^N | s_n = m)}{p(R_{n+1}^N | R_1^N)}. \quad (4)$$

The sequence:

$$R_v^\mu = (R_v, \ldots, R_\mu), \ 1 \leq v < \mu \leq N \quad (5)$$

consists of the three values $R_n = (x_n, y1_n, z_n)$ of systematic information, redundancy information, and recursion information that are defined in order to simplify the notation.

The expression $\alpha_n^i(m)$ can be calculated by a forward recursion, and the expression $\beta_n(m)$ can be calculated by a backward recursion. The expressions are therefore also designated as forward and backward metrics. A detailed description of the recursions (using an (optimum) MAP symbol estimation) is given in chapter E.3.3 "Rekursive MAP-Symbolschätzung" ["Recursive MAP symbol estimation"] of the above-named book by P. Jung on pages 353 to 361. The recursions run over the entire block, that is to say the forward recursion begins at the instant 1 (first bit of the sequences $\hat{X}, \hat{Y}1, Z$) and ends at the instant N (last bit of the sequences $\hat{X}, \hat{Y}1, Z$) and the backward recursion begins at the instant N and ends at the instant 1.

Figure 5:
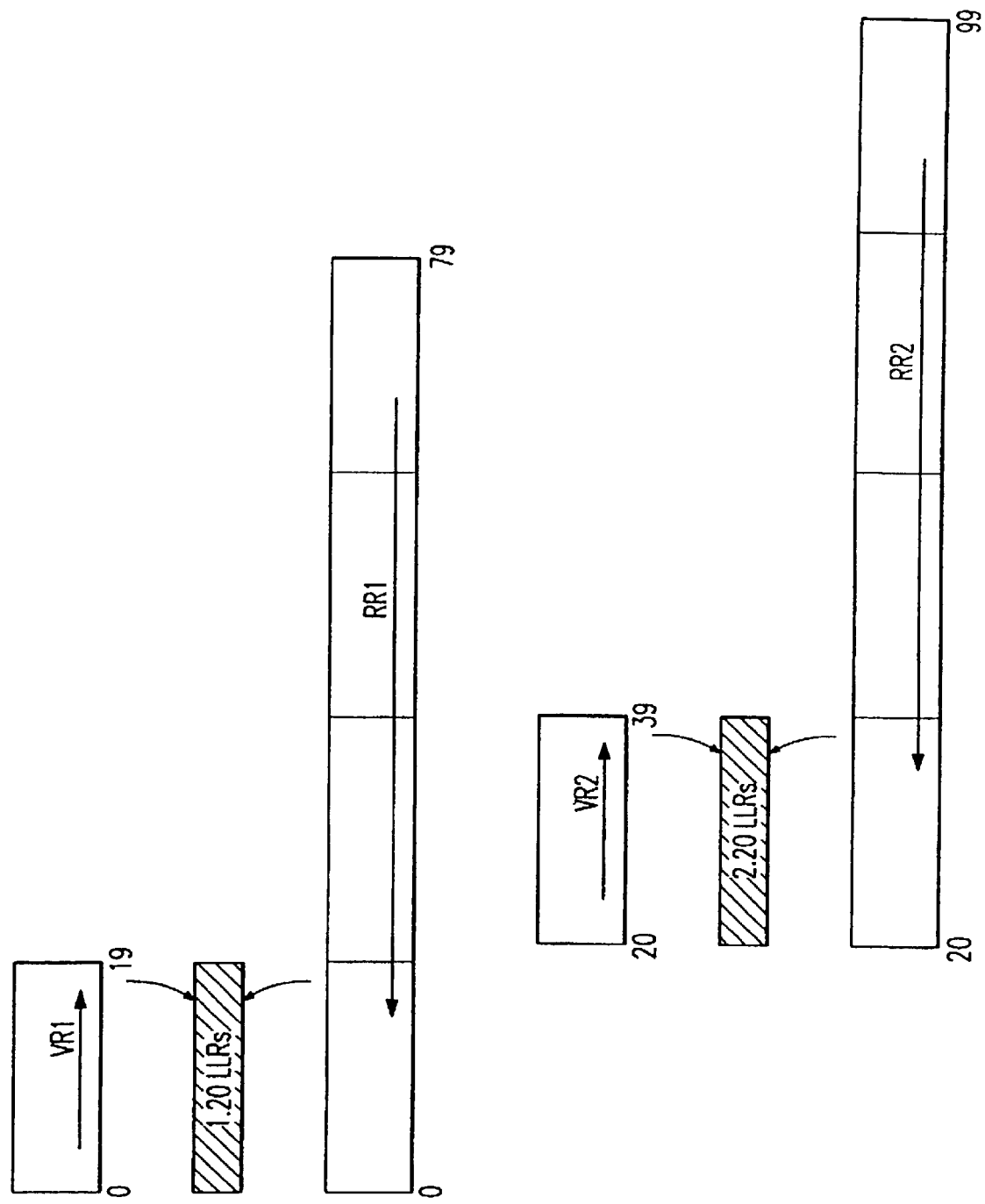
FIG. 5 is a schematic illustration for explaining the inventive segment-by-segment forward and backward recursions when calculating reliability information in a symbol estimator of the turbo decoder.

An exemplary embodiment of the inventive method that includes performing a plurality of subinterval recursion runs for calculating the LLRs from equations (1), (3) is explained below with the aid of FIG. 5.

Let N=300, for example. Starting at n=0, first, for example, the first 20 values $\alpha_0^i(m), \ldots, \alpha_{19}^i(m)$ are initially determined in a first forward recursion run VR1, and are buffered in a forward recursion memory area (not illustrated) of the convolutional decoder DEC1.

The associated first backward recursion RR1 begins here, for example, at n=79 and runs up to n=0. The corresponding values for $\beta_n(m)$ are calculated and buffered in a backward recursion memory area (not illustrated) of the convolutional decoder DEC1.

All 20 calculated values for $\alpha_n^i(m)$ and the last twenty calculated values for $\beta_n(m)$ are used in order to calculate the LLRs in the block segment n=0, 1, . . . , 19.

After the calculation of the first 20 LLRs, the two recursion intervals (recursion windows) are each displaced by 20 values. The second forward recursion VR2 therefore begins at n=20 and runs up to n=39. The result data obtained in the first forward recursion VR1 can be overwritten when buffering the values $\alpha_{20}^i(m), \ldots, \alpha_{39}^i(m)$. The associated second backward recursion RR2 starts at n=99 and runs back to n=20. The result data determined in the first backward recursion RR1 can also be overwritten here by the new data values $\beta_n(m)$, n=99 to 20. In order to calculate the LLRs in the block segment n=20, 21, . . . , 39, once again all 20 calculated values are used for $\alpha_n^i(m)$ and the last twenty calculated values are used for $\beta_n(m)$.

This segment-by-segment determination of the LLRs with floating forward and backward recursion windows is continued in the way described until all LLRs of the data block are calculated. Because of the segment-by-segment mode of calculation, the dataset that must be buffered during processing of a block segment is substantially reduced by comparison with the multi-block recursion runs used in the prior art.

Again, it is possible, and from the point of view of economizing memory space requirement, it is preferred to manage without a backward recursion memory area. In the case of such a hardware design, the LLRs of the respective block segment are calculated from the stored forward recursion values and the currently calculated backward recursion values directly (that is to say without buffering the latter).

The forward and backward recursions illustrated in FIG. 5 can be generalized advantageously as follows: the length of the forward recursion window (here—20) is denoted by D(VR), and the length of the backward recursion window (here: 80) is denoted by D(RR). The length of the backward recursion window is preferably determined in accordance with the relationship D(RR)=L×D(VR), L being the fallback depth (in the present example, L=4).

Two possibilities of calculating the forward and backward recursion expressions $\alpha_n^i(m), \beta_n(m)$ are specified below.

According to a first, known possibility, that is described in detail on pages 353 to 361 in chapter E.3.3 "Rekursive MAP-Symbolschätzung" ["Recursive MAP symbol estimation"] of the abovenamed book by P. Jung, which is incorporated in this regard into the subject matter of this document by reference, carrying out an MAP symbol estimation results in:

$$\alpha_n^i(m) = \frac{\sum_{m'=1}^{M} \sum_{j=0}^{1} \gamma_n^j(R_n, m', m) \cdot \alpha_{n-1}^j(m')}{\sum_{m=1}^{M} \sum_{m'=1}^{M} \sum_{k=0}^{1} \sum_{j=0}^{1} \gamma_n^k(R_n, m', m) \cdot \alpha_{n-1}^j(m')}, \quad (6)$$

i=0,1 n=1, . . . , N for the forward recursion, and in:

$$\beta_n(m) = \frac{\sum_{m'=1}^{M} \sum_{j=0}^{1} \gamma_{n+1}^j(R_{n+1}, m, m') \cdot \beta_{n+1}(m')}{\sum_{m=1}^{M} \sum_{m'=1}^{M} \sum_{k=0}^{1} \sum_{j=0}^{1} \gamma_{n+1}^k(R_{n+1}, m', m) \cdot \alpha_n^j(m')}, \quad (7)$$

m=1, . . . M n=1, . . . , N
for the backward recursion.

The expressions $\gamma_n^i(R_n, m', m)$ are the transition probabilities from a first state $S_{n-1}=m'$ into a second state $S_n=m$ of the coder RSC1 in the trellis diagram, that is to say:

$$\gamma_n^i(R_n, m', m) = P(u_n = i, S_n = m, R_n | S_{n-1} = m') \quad (8).$$

A second possibility for calculating the forward and backward recursion expressions $\alpha_n^i(m), \beta_n(m)$ is specified below. As may be seen from the following equations, the computational outlay is substantially reduced in this second possibility in comparison with the first possibility:

$$\alpha_n^i(m) = \sum_{m'=0}^{M} \sum_{j=0}^{1} \alpha_{n-1}^j(m') \cdot \gamma_n^j(R_n, m', m), \quad (9)$$

i=0,1, n=1, . . . , N; and $$\beta_n(m) = \sum_{m'=1}^{M} \sum_{j=0}^{1} \beta_{n+1}(m') \cdot \gamma_{n+1}^j(R_{n+1}, m, m'), \quad (10)$$

where m=1, . . . , M, n=1, . . . , N.

In contrast with the LLRs calculated using equations 6 and 7 (in conjunction with equations 1, 3 and 4) (1st possibility), it is not the ratios of probabilities but the probabilities themselves that are calculated directly in the recursions using equations 9 and 10 (2nd possibility). This certainly leads to a decrease in the computational accuracy, but it is the substantially lower number of computational steps that is advantageous. The second possibility is therefore also designated as suboptimal MAP symbol estimation.

Figure 6:
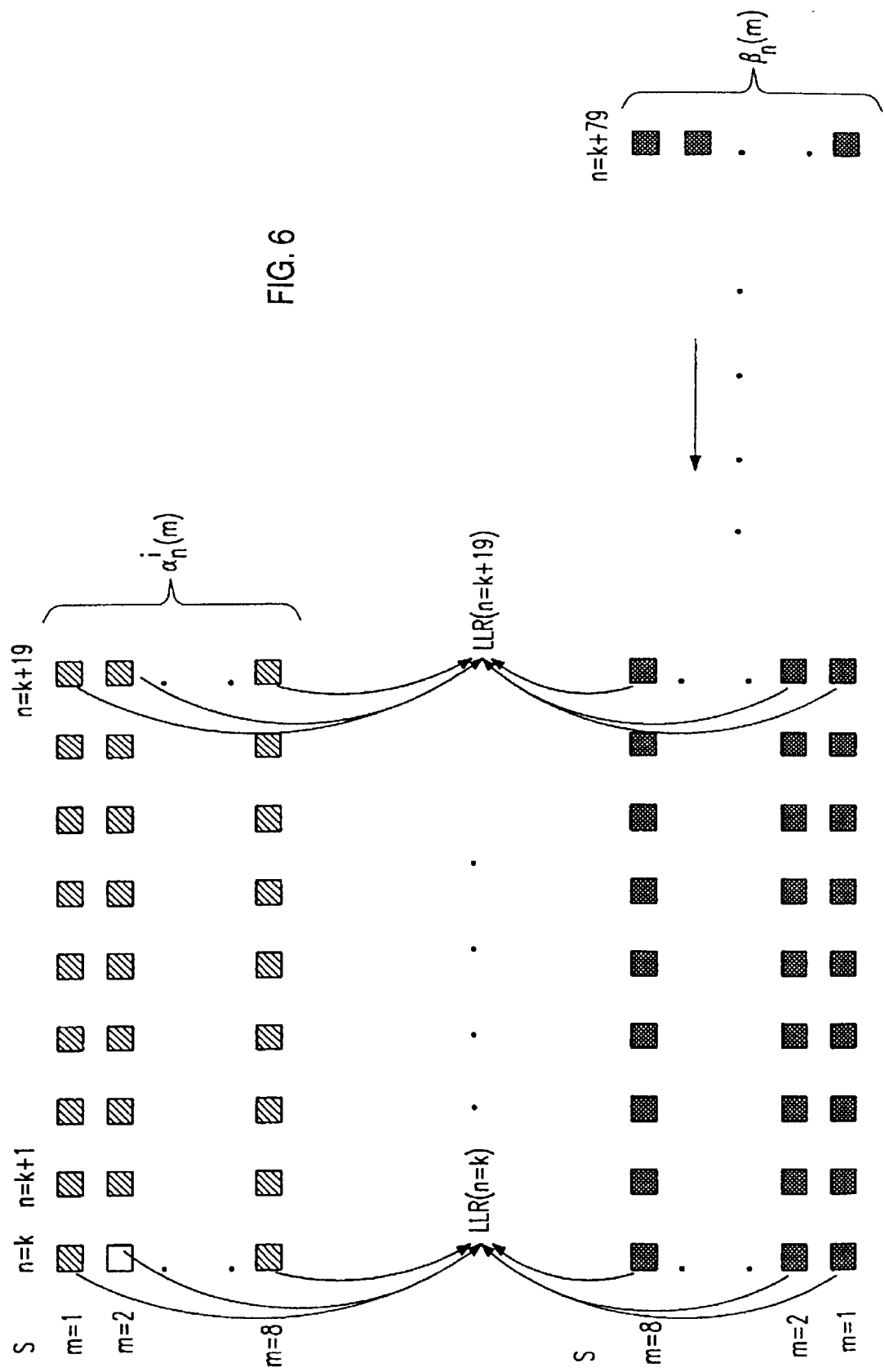
FIG. 6 is a schematic illustration for explaining the computational steps that will be carried out to calculate a logarithmic a-posteriori probability ratio.

FIG. 6 illustrates the summation over the M states of the coder RSC1, that must be carried out in order to calculate the 20 LLRs of a block segment extending from n=k to n=k+19 in accordance with the forward recursion equation (6) or (9) and the backward recursion equation (7) or (10).

In the case of the first forward recursion in a block (that is to say where k=0), all forward recursion expressions $\alpha_0^i(m)$ with the exception of the forward recursion expressions for the initial state m=1 are initialized to the value 0. The initial state m=1 is known to the receiver by prior agreement and is initialized correctly. In the case of the first backward recursion (k=0) in a block, no knowledge is available on the backward recursion initial state, that is to say every possible state is equally probable. Consequently, all initial values $\beta_{80}(m)$ are set to the value 1/M.

In the case of the second and all the following forward recursions, the forward recursion expressions obtained in the respectively preceding forward recursion are normalized and then used as initial values of the current forward recursion. That is to say, the forward recursion expressions are not built up on one another solely within one recursion window, but also with reference to successive recursion windows. In contrast, in the case of the backward recursions (apart from the last backward recursion) the initial states are always unknown, that is to say, the initial values for the backward recursions are always set to 1/M. There is an exception only for the last backward recursion in a block, since here the final state in the trellis diagram is known.

The backward recursion expressions (as initial values for the backward recursion following therefrom) do not have to be normalized because of the relatively small size of the backward recursion window by comparison with the overall possible length of the trellis diagram.

It becomes clear that all possible states of the coder RSC1 are taken into account in calculating the LLRs in accordance with FIG. 6.

We claim:

1. A method for blockwise decoding a data signal, which comprises:

in a transmitter, using a turbo coder to error protection code the data signal;

transmitting the data signal using a radio channel;

providing a receiver having a turbo decoder with two feedback symbol estimators;

using the turbo decoder to detect the data signal by having at least one of the symbol estimators execute a plurality of recursions in order to calculate output values for a data block; and selecting each one of the plurality of the recursions from a group consisting of a forward recursion over a subinterval of the data block and a backward recursion over a subinterval of the data block, the plurality of the recursions including a plurality of forward recursions over subintervals, the subintervals for the plurality of the forward recursions covering the data block completely, each of the subintervals for the plurality of the forward recursions being D(VR) data values long and the subinterval for the backward recursion being D(RR) data values long, the data values corresponding to the formula: D(RR) =D(VR) x L, where L is a failback depth of a convolutional coder that is used to error protection code the data signal.

2. The method according to claim 1, wherein:

each subinterval for a respective one of the plurality of the forward recursions is assigned a subinterval for the backward recursion that includes the subinterval for the respective one of the plurality of the forward recursions; and a calculation of an nth output value of the data block is based only on one of the plurality of the forward recursions over a subinterval including an nth data value and on a backward tecursion over an assigned subinterval, wherein n is an interger value.

3. The method according to claim 1, wherein: D(VR) lies between 10 and 30.

4. The method according to claim 1, wherein: D(VR) is 20.

5. The method according to claim 1, which further comprises:

in a recursion over a subinterval in a given direction, using calculated metrics of the turbo coder as initial values in a subsequent recursion of the given direction.

6. The method according to claim 1, which comprises:

using a suboptimal MAP algorithm to calculate the output values of the at least one of the symbol estimators.

7. The method according to claim 1, wherein:

each subinterval for a respective forward recursion is assigned a subinterval for the backward recursion that includes the subinterval for the respective forward recursion; and a calculation of an nth output value of the data block is based only on a forward recursion over a subinterval including an nth data value, and on the backward recursion over an assigned subinterval, wherein n is an integer value.

* * * * *